(12) United States Patent
Shintani et al.

(10) Patent No.: US 10,881,023 B2
(45) Date of Patent: Dec. 29, 2020

(54) ELECTRONIC COMPONENT AND POWER CONVERSION DEVICE

(71) Applicant: FUJI ELECTRIC CO., LTD., Kawasaki (JP)

(72) Inventors: Takanori Shintani, Suzuka (JP); Isao Oka, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/370,375

(22) Filed: Mar. 29, 2019

(65) Prior Publication Data
US 2019/0230812 A1 Jul. 25, 2019

Related U.S. Application Data

(63) Continuation of application No. PCT/JP2018/007316, filed on Feb. 27, 2018.

(30) Foreign Application Priority Data

Apr. 27, 2017 (JP) ................................. 2017-088809
Aug. 8, 2017 (JP) ................................. 2017-152843

(51) Int. Cl.
*H05K 7/20* (2006.01)
*H01R 9/24* (2006.01)
*H02M 7/48* (2007.01)
*H01R 4/38* (2006.01)

(52) U.S. Cl.
CPC ............. *H05K 7/2039* (2013.01); *H01R 4/38* (2013.01); *H01R 9/24* (2013.01); *H02M 7/48* (2013.01)

(58) Field of Classification Search
CPC .......... H05K 7/2039; H01R 4/38; H01R 9/24; H02M 7/48
See application file for complete search history.

(56) References Cited

U.S. PATENT DOCUMENTS 4,872,102 A * 10/1989 Getter ................... H02M 7/003
                                                363/141
5,532,557 A *  7/1996 Saidian ................. F21V 19/006
                                                307/116
(Continued)

FOREIGN PATENT DOCUMENTS

CN     102195501 A    9/2011
JP     2006-194650 A  7/2006
(Continued)

OTHER PUBLICATIONS

Japanese Office Action dated Jun. 13, 2017, in corresponding Japanese Patent Application No. 2017-088809.
(Continued)

*Primary Examiner* — Binh B Tran
*Assistant Examiner* — Michael A Matey

(57) ABSTRACT

Provided is an electronic component (13) that can be miniaturized while including a cooling structure. The electronic component includes an electronic component main body (13a), a bus bar (31) arranged inside the electronic component main body, and a heat dissipating member (40) embedded in the electronic component main body and having one end face thermally in contact with the bus bar and the other end face exposed to an outside of the electronic component main body.

20 Claims, 11 Drawing Sheets

(56) References Cited

U.S. PATENT DOCUMENTS

| | | | | |
|---|---|---|---|---|
| 6,442,023 B2* | 8/2002 | Cettour-Rose | ........ | H02M 7/003 165/104.33 |
| 7,443,692 B2* | 10/2008 | Patwardhan | .......... | H02M 1/126 361/775 |
| 8,123,573 B2 | 2/2012 | Takehara et al. | | |
| 8,422,230 B2* | 4/2013 | Aiba | ........................ | H05K 7/20 165/104.33 |
| 8,460,039 B2 | 6/2013 | Akuta | | |
| 8,902,612 B2 | 12/2014 | Inuduka et al. | | |
| 8,953,335 B2* | 2/2015 | Abe | ........................ | H01L 23/36 165/80.2 |
| 9,312,782 B2* | 4/2016 | Tachibana | ............. | H02M 7/003 |
| 9,472,938 B2* | 10/2016 | Hwang | ................ | H05K 7/1432 |
| 9,516,776 B2* | 12/2016 | Kawamura | .......... | H01H 50/048 |
| 10,439,379 B2* | 10/2019 | Tahara | ................. | H05K 5/0043 |
| 2007/0109715 A1* | 5/2007 | Azuma | ................... | B60L 50/16 361/299.3 |
| 2008/0117602 A1* | 5/2008 | Korich | .................... | H01G 2/08 361/715 |
| 2008/0130223 A1* | 6/2008 | Nakamura | ............ | H02M 7/003 361/689 |
| 2009/0107655 A1* | 4/2009 | Kajiura | ................... | F28F 3/025 165/80.3 |
| 2011/0130028 A1 | 6/2011 | Takehara et al. | | |
| 2011/0181105 A1* | 7/2011 | Michinaka | ............ | H01L 25/162 307/9.1 |
| 2011/0228508 A1* | 9/2011 | Inuduka | ................ | H02M 7/003 361/811 |
| 2011/0304948 A1* | 12/2011 | Lee | ........................ | H01G 9/155 361/301.1 |
| 2012/0190251 A1 | 7/2012 | Akuta | | |
| 2013/0044434 A1* | 2/2013 | Sharaf | ................ | H05K 7/20927 361/702 |
| 2013/0170269 A1* | 7/2013 | Sharaf | ...................... | H01G 2/08 363/141 |
| 2013/0215573 A1* | 8/2013 | Wagner | ................. | H02M 7/003 361/702 |
| 2013/0223009 A1* | 8/2013 | Nakatsu | ................ | H02M 7/003 361/699 |
| 2014/0198475 A1* | 7/2014 | Menzies | ................ | H01R 13/08 361/811 |
| 2014/0254103 A1* | 9/2014 | Yoshimi | ............... | H05K 7/2089 361/719 |
| 2014/0286064 A1* | 9/2014 | Kamizuma | ............ | H01G 4/258 363/123 |
| 2015/0008574 A1* | 1/2015 | Gohara | ................. | H01L 23/473 257/714 |
| 2016/0286638 A1* | 9/2016 | Mitsui | ....................... | G06F 1/20 |
| 2016/0343641 A1* | 11/2016 | Hori | ...................... | H01L 23/473 |
| 2017/0311433 A1* | 10/2017 | Sumida | .................... | H05K 1/18 |
| 2017/0311457 A1* | 10/2017 | Kubota | ................... | B60R 16/03 |
| 2017/0341607 A1* | 11/2017 | Sumida | ................ | B60R 16/0239 |
| 2017/0343586 A1* | 11/2017 | Oka | ...................... | G01R 15/183 |
| 2018/0003179 A1* | 1/2018 | Nakamoto | .............. | F04B 39/06 |
| 2018/0006414 A1* | 1/2018 | Ooishi | ................... | H02G 3/088 |
| 2018/0006441 A1* | 1/2018 | Sumida | ............. | H05K 7/20854 |
| 2018/0034169 A1* | 2/2018 | Haraguchi | .......... | B60R 16/0238 |
| 2019/0075678 A1* | 3/2019 | Aragones Carrete | ........................ | H01R 9/2458 |
| 2019/0123539 A1* | 4/2019 | Tahara | ..................... | H02G 3/16 |
| 2019/0173067 A1* | 6/2019 | Nishimata | ............ | H01M 2/1083 |
| 2019/0214805 A1* | 7/2019 | Hiramitsu | .......... | H05K 7/20254 |
| 2019/0369143 A1* | 12/2019 | Kawaguchi | .......... | H01R 11/287 |

FOREIGN PATENT DOCUMENTS

| | | |
|---|---|---|
| JP | 2007-166803 A | 6/2007 |
| JP | 2011-113946 A | 6/2011 |
| JP | 2012-151040 A | 8/2012 |
| JP | 2015-84609 A | 4/2015 |

OTHER PUBLICATIONS

International Search Report dated Apr. 10, 2018 in corresponding International Application No. PCT/JP2018/007316.

Written Opinion of the International Searching Authority dated Apr. 10, 2018 in corresponding International Application No. PCT/JP2018/007316.

Chinese Office Action dated Jun. 3, 2020, in Chinese Patent Application No. 201880003765.7 with machine translation (13 pages in total).

* cited by examiner

ELECTRONIC COMPONENT AND POWER CONVERSION DEVICE

CROSS REFERENCE TO RELATED APPLICATIONS

This application is a continuation of International Application No. PCT/JP2018/007316 filed Feb. 27, 2018, which claims foreign priority benefit to Japanese Patent Application No. 2017-088809 filed Apr. 27, 2017 and Japanese Patent Application No. 2017-152843, filed Aug. 8, 2017, the entire disclosures of which are herein incorporated by reference as part of this application.

TECHNICAL FIELD

The present invention relates to an electronic component with which a terminal block supporting a terminal is integrated and to a power conversion device.

BACKGROUND ART

In power conversion devices, a plurality of electronic components such as power semiconductor modules for power conversion are stored in a housing.

As an electronic component to be stored in the housing, there is known a current detector also serving as a terminal block of a power conversion device (e.g., PTL 1). In the current detector of PTL 1, a bus bar, which is crimp connected with a bolt, is resin-molded together with a core, a magnetic flux density detection element, and a circuit board.

Using the current detector of PTL 1 also serving as a terminal block can reduce the number of components of a power conversion device, thereby enabling miniaturization of the device.

CITATION LIST

Patent Literature

PTL 1: JP 2006-194650 A

SUMMARY OF INVENTION

Technical Problem

Herein, in a power conversion device, large heat generation occurs due to power loss at a connection portion electrically connecting a power semiconductor module to the current detector. Thus, it is conceivable that a cooling component for cooling the connection portion is stored between the power semiconductor module and the current detector. However, storing the cooling component between the power semiconductor module and the current detector may increase a storage space of the cooling component, thereby being likely to hinder miniaturization of the power conversion device.

Thus, it is an object of the present invention to provide an electronic component that can be miniaturized while including a cooling structure and a power conversion device that can be miniaturized while including a cooling structure in an electronic component in which a terminal block is integrated.

Solution to Problem

To achieve the above object, an electronic component according to one aspect of the present invention includes an electronic component main body, a bus bar arranged inside the electronic component main body, and a heat dissipating member embedded in the electronic component main body and having one end face thermally in contact with the bus bar and the other end face exposed outside the electronic component main body.

Additionally, a power conversion device according to one aspect of the present invention includes a housing including a heat sink portion and an electronic component stored in the housing, in which, in the electronic component, a terminal block configured to support a connection terminal portion of a bus bar extending from an electronic component main body is integrally formed on the electronic component main body, and a heat dissipating member configured to thermally connect the connection terminal portion and the heat sink portion is integrated, the heat dissipating member being provided inside the terminal block to be thermally connected to the heat sink portion.

Advantageous Effects of Invention

The electronic component according to the present invention can be miniaturized while including the cooling structure. Additionally, the power conversion device according to the preset invention can be miniaturized while including the cooling structure in the electronic component in which the terminal block is integrated.

DESCRIPTION OF EMBODIMENTS

Figure 1:
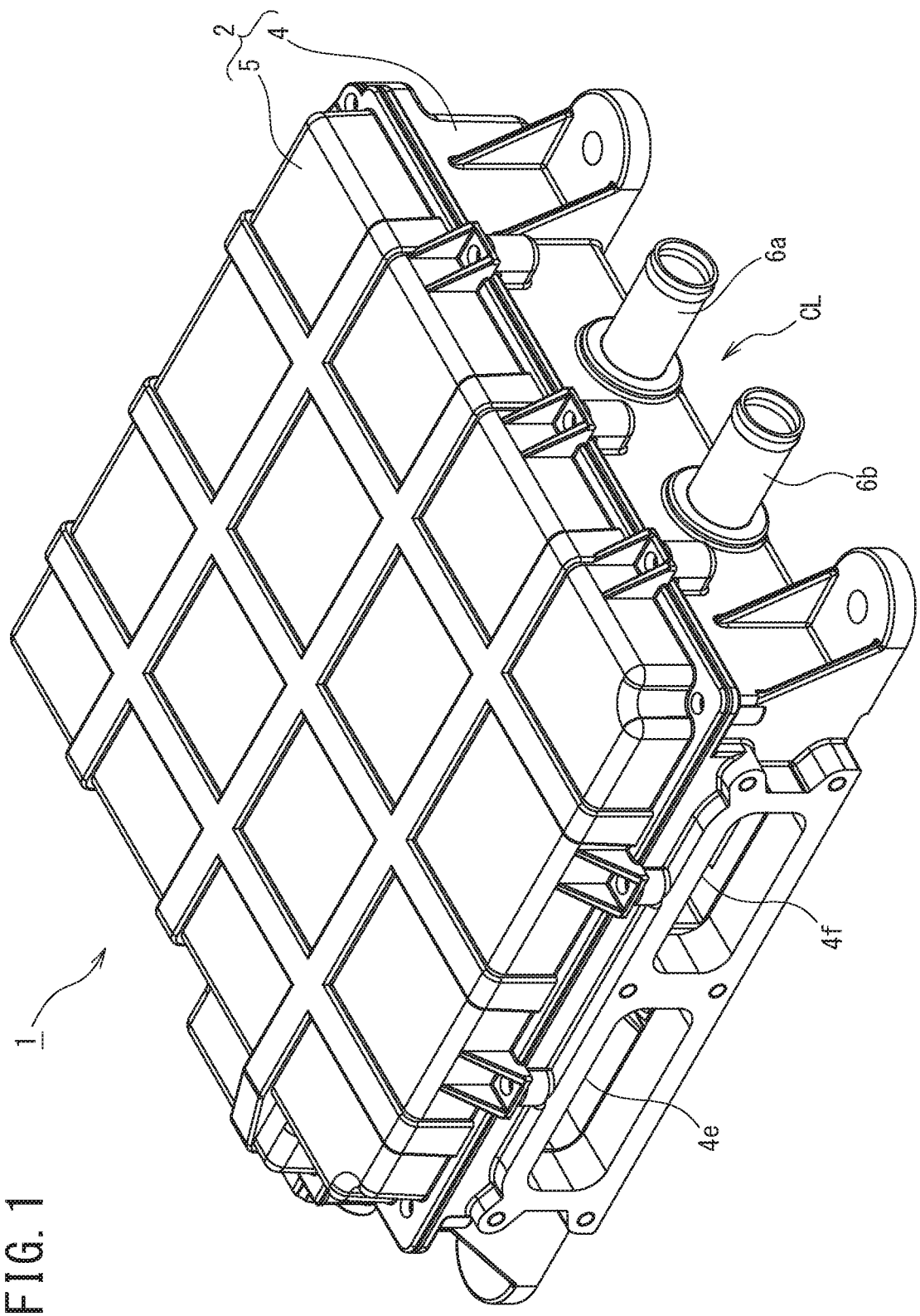
FIG. 1 is a perspective diagram illustrating an external appearance of a power conversion device including an electronic component of a first embodiment according to the present invention.

Next, a first embodiment of the present invention will be described with reference to the drawings. In the following description of the drawings, the same or similar portions are denoted by the same or similar reference signs. However, the drawings are only schematic, so that it should be noted that the relationship between thickness and planar dimensions, layer thickness ratios, and the like are different from those in reality. Accordingly, specific thicknesses and dimensions should be determined in consideration of the following description. It is also obvious that there are some differences between the mutual drawings in terms of dimensional relationship and ratio.

Additionally, the following first embodiment exemplifies devices and methods for embodying the technological idea of the present invention, and the technological idea of the present invention does not specify the materials, shapes, structures, arrangements, and the like of constituent components to those described below. Various modifications can be made to the technological idea of the present invention without departing from the technological scope prescribed by the claims.

Hereinafter, a mode for implementing the present invention (hereinafter referred to as embodiment) will be described in detail with reference to the drawings. Note that the terms indicating directions such as "upper", "lower", "bottom", "front", "back", and "right and left" are used with reference to directions in the accompanying drawings.

Power Conversion Device Including Electronic Component of First Embodiment

Hereinafter, a description will be given of a power conversion device including a DC input connector that is an electronic component of a first embodiment according to one aspect of the present invention, by referring to the drawings as appropriate.

As illustrated in FIG. 1, a power conversion device 1 includes a housing 2 and a cooling water circulation portion CL provided on a bottom portion of the housing 2. The housing 2 is formed by including a case 4 and a cover 5, which are cast products made of aluminum or an aluminum alloy.

Figure 2:
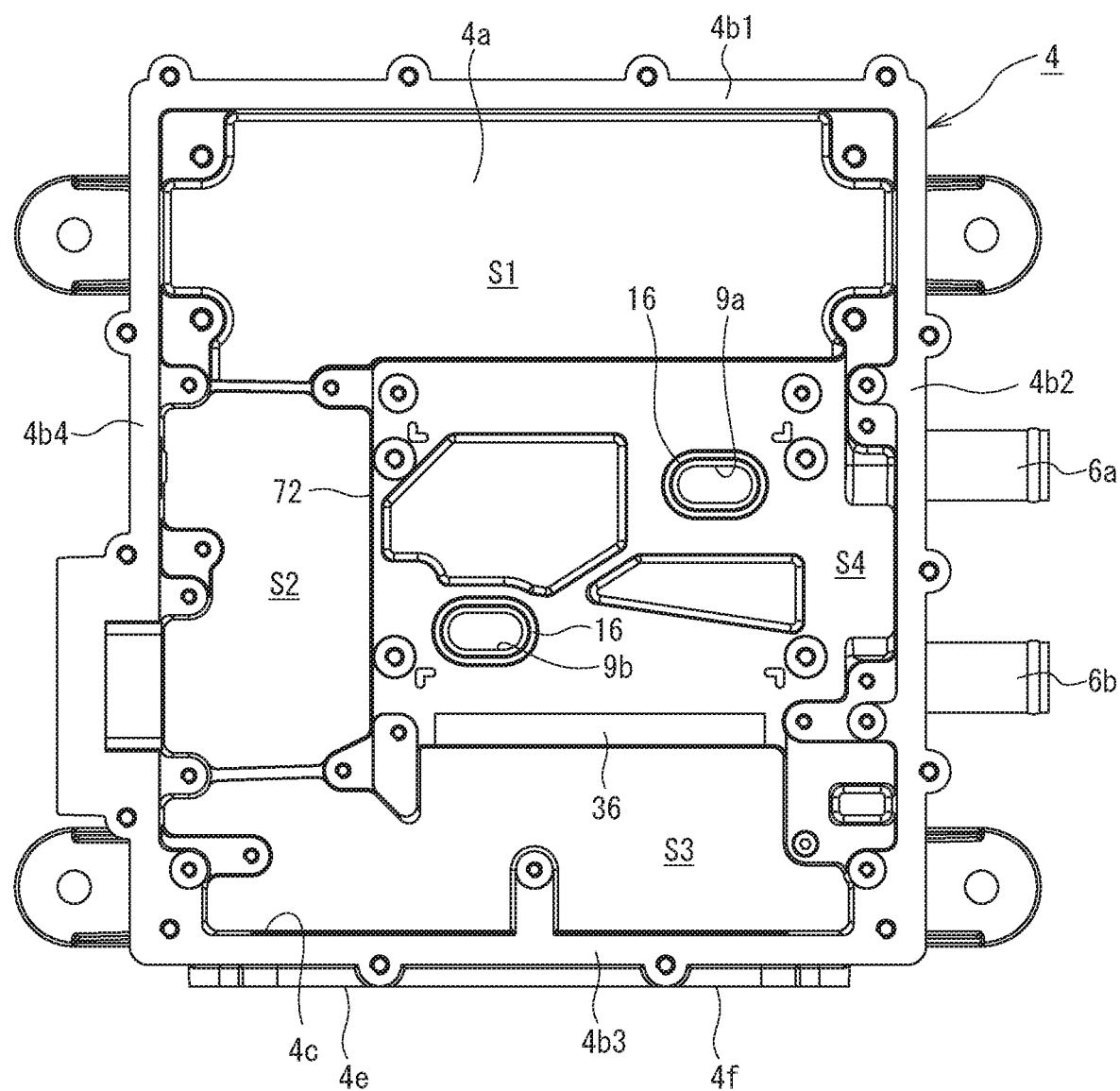
FIG. 2 is a diagram illustrating an inside of a bottom wall of a housing of the power conversion device illustrated in FIG. 1.
Figure 3:
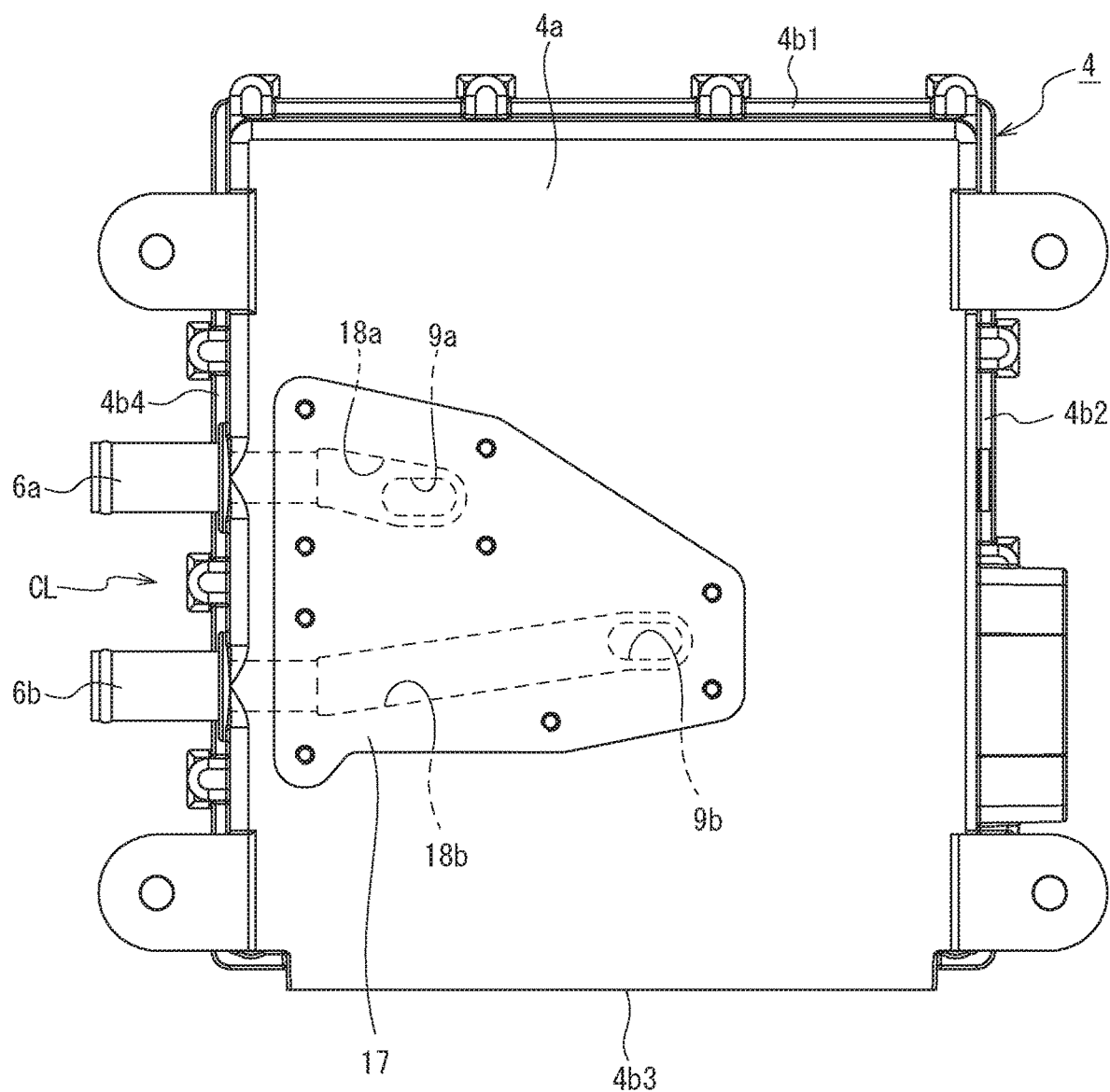
FIG. 3 is a diagram illustrating a state where a flow path cover is attached to an outside of the bottom wall of the housing of the power conversion device illustrated in FIG. 1.
Figure 4:
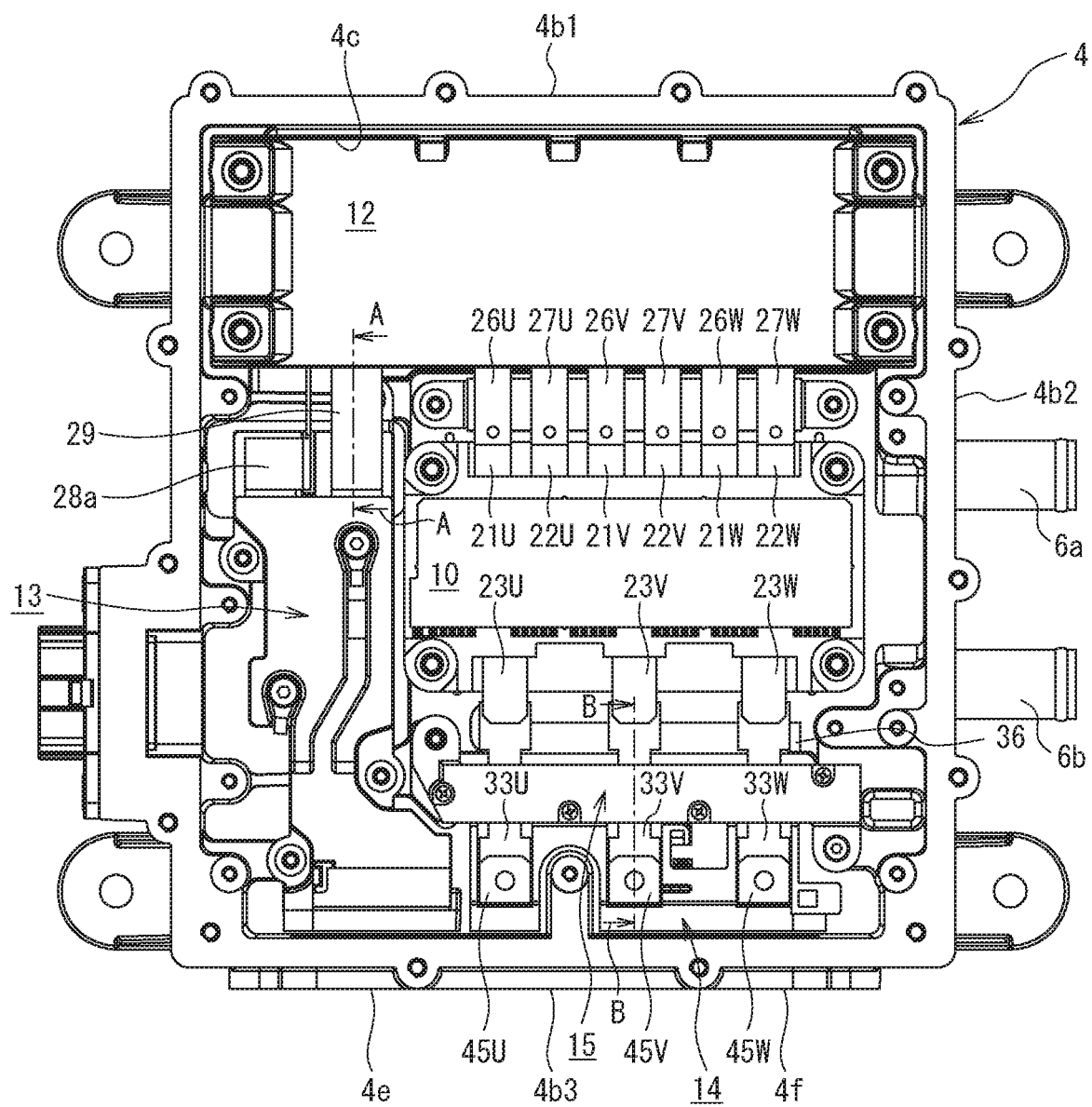
FIG. 4 is a diagram illustrating a state where main components of the power conversion device are arranged inside the housing of the power conversion device illustrated in FIG. 1.

FIG. 2 illustrates an inside of the case 4, and FIG. 3 illustrates the case 4 from an outside thereof.

As illustrated in FIG. 2, the case 4 includes a rectangular bottom wall 4a, first to fourth sidewalls 4b1 to 4b4, rising from the entire circumference of the bottom wall 4a an opening portion 4c opened at upper ends of the first to fourth sidewalls 4b1 to 4b4, and an inlet-side opening portion 9a and an outlet-side opening portion 9b communicating with the bottom wall 4a. A cooling water supply pipe 6a and a cooling water discharge pipe 6b are connected to the second sidewall 4b2 by press fitting or welding, and an external input connection port 4e and an external output connection port 4f are opened in the third sidewall 4b3. Then, outside the inlet-side opening portion 9a is formed a circumferential groove (unillustrated), and an O ring 16 is mounted in the circumferential groove. Additionally, outside the outlet-side opening portion 9b, a circumferential groove (unillustrated) is also formed, and an O ring 16 is mounted in the circumferential groove.

As illustrated in FIG. 3, outside the bottom wall 4a of the case 4 are formed an inlet-side groove extending in a right-left direction and an outlet-side groove extending to be longer than the inlet-side groove in the right-left direction, in which on a right end portion side of the inlet-side groove is formed the inlet-side opening portion 9a penetrating through the bottom wall 4a, and on a right end portion side of the outlet-side groove is formed the outlet-side opening portion 9b penetrating through the bottom wall 4a. Then, a flow path cover 17 is fixed so as to close the opening portions of the inlet-side groove and the outlet-side groove, and there are formed an inlet-side flow path 18a communicating with the cooling water supply pipe 6a and the inlet-side opening portion 9a and an outlet-side flow path 18b communicating with the cooling water discharge pipe 6b and the outlet-side opening portion 9b.

As a result, the above-mentioned cooling water circulation portion CL is formed by the cooling water supply pipe 6a, the inlet-side flow path 18a, the inlet-side opening portion 9a, the cooling water discharge pipe 6b, the outlet-side flow path 18b, and the outlet-side opening portion 9b.

As illustrated in FIG. 2, inside the case 4 are provided a first storage space S1 storing a smoothing capacitor 12, a second storage space S2 storing a DC input connector 13 that is the electronic component of the first embodiment according to the one aspect of the present invention, a third storage space S3 storing a current detector 15 and an AC output connector 14, and a fourth storage space S4 storing an IGBT module 10.

The first storage space S1 extends along the first sidewall 4b1, and is provided as a long space to the second sidewall 4b2 and the fourth sidewall 4b4 facing each other.

The second storage space S2 is a long space extending along the fourth sidewall 4b4, in which one end of the space in a longitudinal direction faces the first storage space S1, and the other end thereof in the longitudinal direction is provided to the third sidewall 4b3.

The third storage space S3 is along space extending along the third sidewall 3b3, in which one end of the space in the longitudinal direction faces the second storage space S2, and the other end thereof in the longitudinal direction is provided to the second sidewall 4b2.

The fourth storage space S4 is a space surrounded by the first storage space S1, the second storage space S2, the third storage space S3, and the second sidewall 4b2.

Herein, between the third storage space S3 and the fourth storage space S4 is formed a rising portion 36 protruding from a partial part of the bottom wall 4a and having a flat upper surface.

[IGBT Module]

Figure 5:
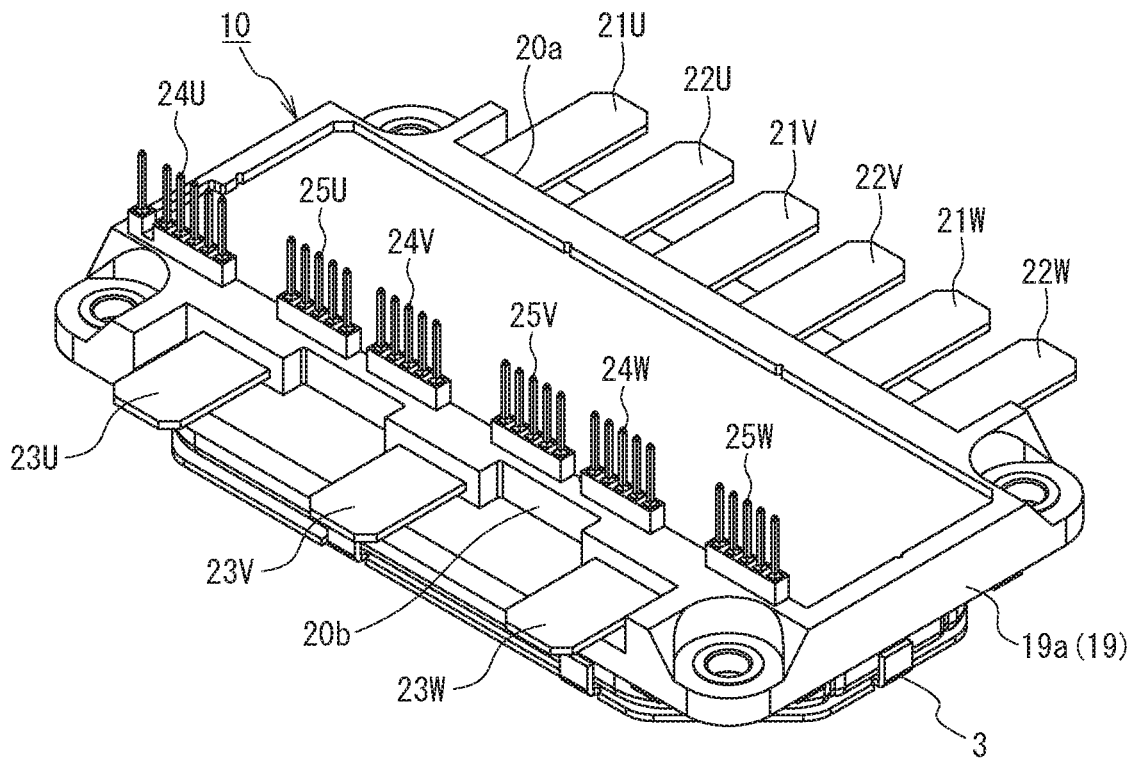
FIG. 5 is a perspective diagram illustrating a front side of a power semiconductor module forming the power conversion device illustrated in FIG. 1.
Figure 6:
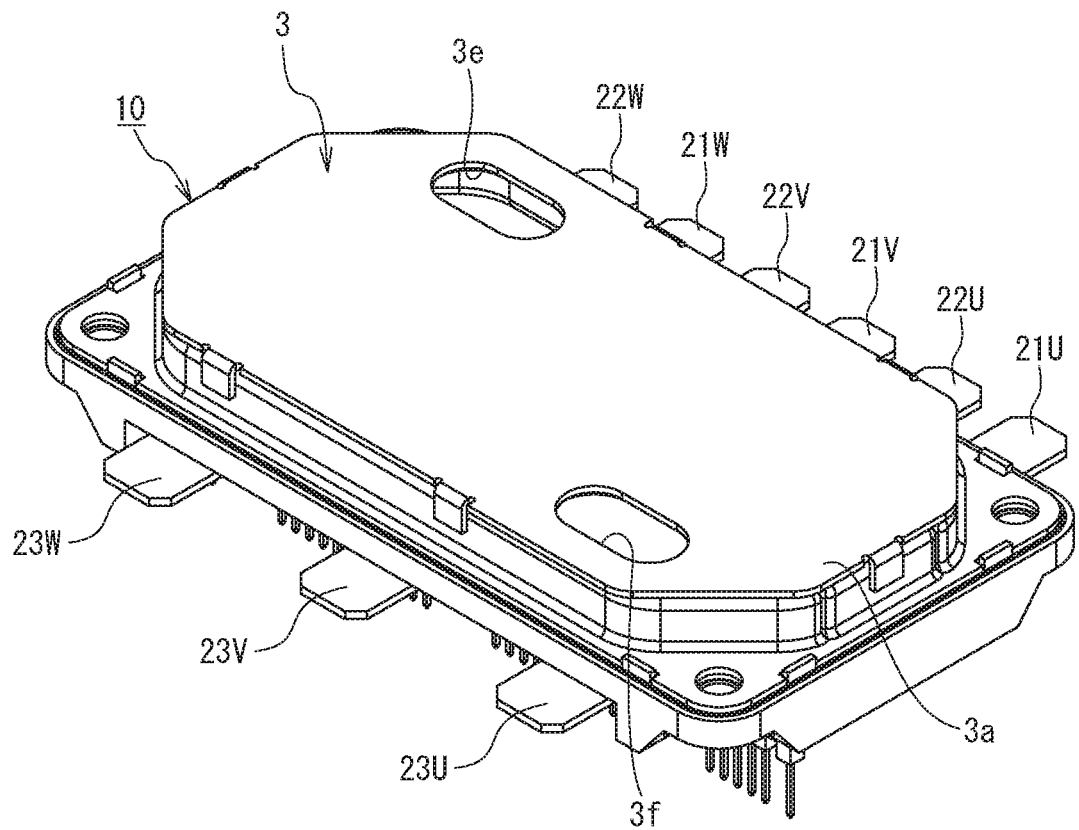
FIG. 6 is a perspective diagram illustrating a back side of the power semiconductor module of FIG. 5.

FIGS. 5 and 6 illustrate an IGBT module 10 that includes a module main body 19 and a cooler 3 integrally provided on the module main body 19 and connected to the cooling water circulation portion CL provided on the housing 2 so that cooling water circulates therein.

The module main body 19 includes a resin package 19a having a rectangular parallelepiped shape and a metal base plate (unillustrated) arranged on a bottom surface of the resin package 19a, and the cooler 3 is integrally provided on a metal base plate side of the module main body 19.

Unillustrated three IGBT upper arm semiconductor chips, an upper arm wiring pattern portion, an upper arm wiring conductor plate, lower arm semiconductor chips, a lower arm wiring pattern portion, a lower arm wiring conductor plate, and a ground wiring pattern, and the like are embedded in the resin package 19a. The upper arm semiconductor chips and the lower arm semiconductor chips are in contact with the metal base plate.

In the resin package 19a, positive electrode-side terminals 21U, 21V, and 21W and negative electrode-side terminals 22U, 22V, and 22W each having a flat plate shape are provided protruding in line from one side face 20a in a longitudinal direction of the resin package 19a in such a manner that mutual plate widthwise ends thereof face each other, as well as output terminals 23U, 23V, and 23W each having a flat plate shape are provided protruding in line from the other side face 20b in the longitudinal direction thereof in such a manner that mutual plate widthwise ends thereof face each other.

The positive electrode-side terminals 21U, 21V, and 21W are connected to collectors of the upper arm semiconductor chips via the upper arm wiring pattern portion, and the negative electrode-side terminals 22U, 22V, and 22W are connected to emitters of the lower arm semiconductor chips via the ground wiring pattern portion and the lower arm wiring conductor plate. The output terminals 23U, 23V, and 23W are connected to the emitters of the upper arm semiconductor chips and the collectors of the lower arm semiconductor chips via the lower arm wiring pattern portion and the upper arm wiring conductor plate.

In addition, on an upper surface of the resin package 19a, a plurality of upper arm lead frames 24U, 24V, and 24W connected to a plurality of upper arm control electrodes and a plurality of lower arm lead frames 25U, 25V, and 25W connected to a plurality of lower arm control electrodes are provided protruding upward.

As illustrated in FIG. 6, the cooler 3 is bonded to the bottom surface of the resin package 19a.

On a bottom wall 3a of the cooler 3 are formed an inlet-side opening portion 3e connected to the inlet-side opening portion 9a of the case 4 and an outlet-side opening portion 3f connected to the outlet-side opening portion 9b of the case 4.

[Smoothing Capacitor]

Figure 7:
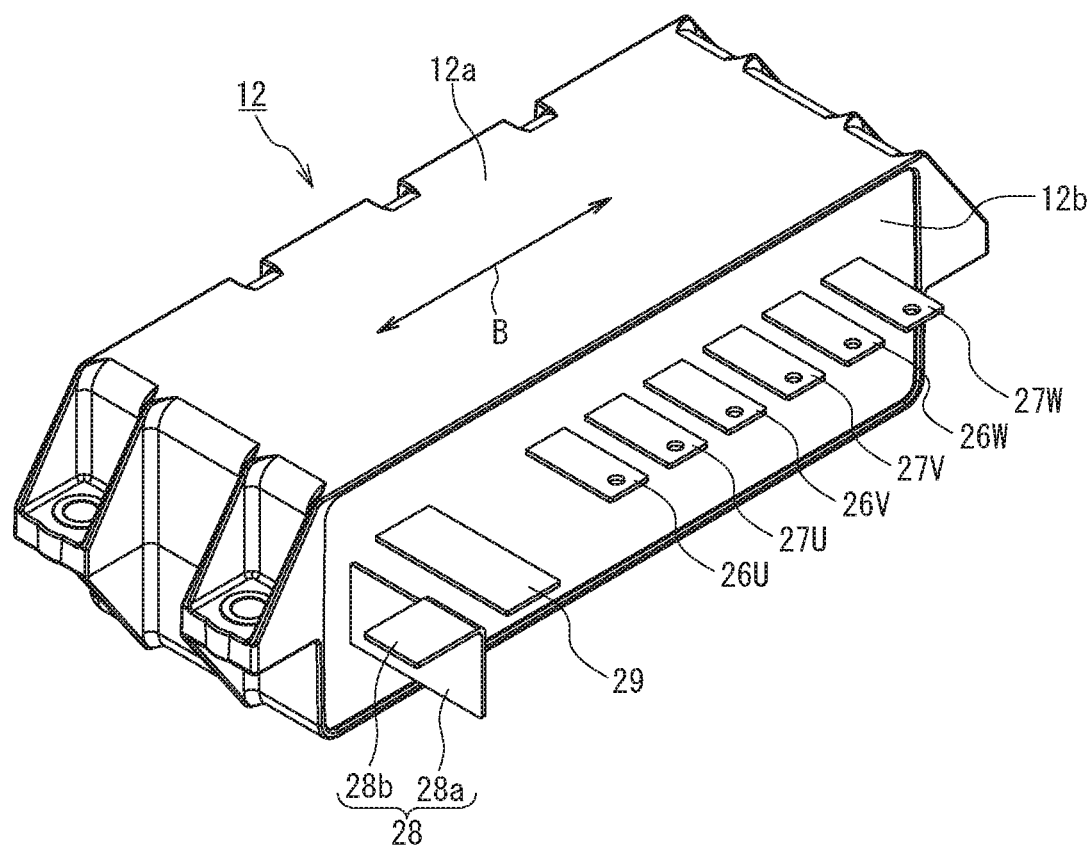
FIG. 7 is a perspective diagram illustrating a smoothing capacitor forming the power conversion device illustrated in FIG. 1.

The smoothing capacitor 12 is a device configured to smooth DC voltage input from the DC input connector 13, and includes a capacitor main body 12a having a substantially rectangular parallelepiped shape and a plurality of terminals provided protruding from a side face 12b extending in a longitudinal direction (an arrow B direction) of the capacitor main body 12a, as illustrated in FIG. 7.

The plurality of terminals of the smoothing capacitor 12 are provided in a position close to a right side of the side face 12b, in which positive electrode-side output terminals 26U, 26V, and 26W and negative electrode-side output terminals 27U, 27V, and 27W each having a flat plate-like shape are provided protruding in line along the longitudinal direction in such a manner that mutual plate widthwise ends thereof face each other.

Additionally, a positive electrode-side input terminal 28 and a negative electrode-side input terminal 29 are provided protruding in a position close to a left side of the side face 12b.

The negative electrode-side input terminal 29 is a flat plate-shaped terminal, and is provided protruding in such a manner that a planar direction of the terminal extends in the longitudinal direction.

The positive electrode-side input terminal 28 is a terminal that includes a flat plate-shaped base portion 28a protruding from the side face 12b in such a manner that a planar direction thereof extends in a direction orthogonal to the longitudinal direction and a connection portion 28b formed by being bent in the longitudinal direction from a leading end side of the base portion 28a.

[DC Input Connector]

Figure 8:
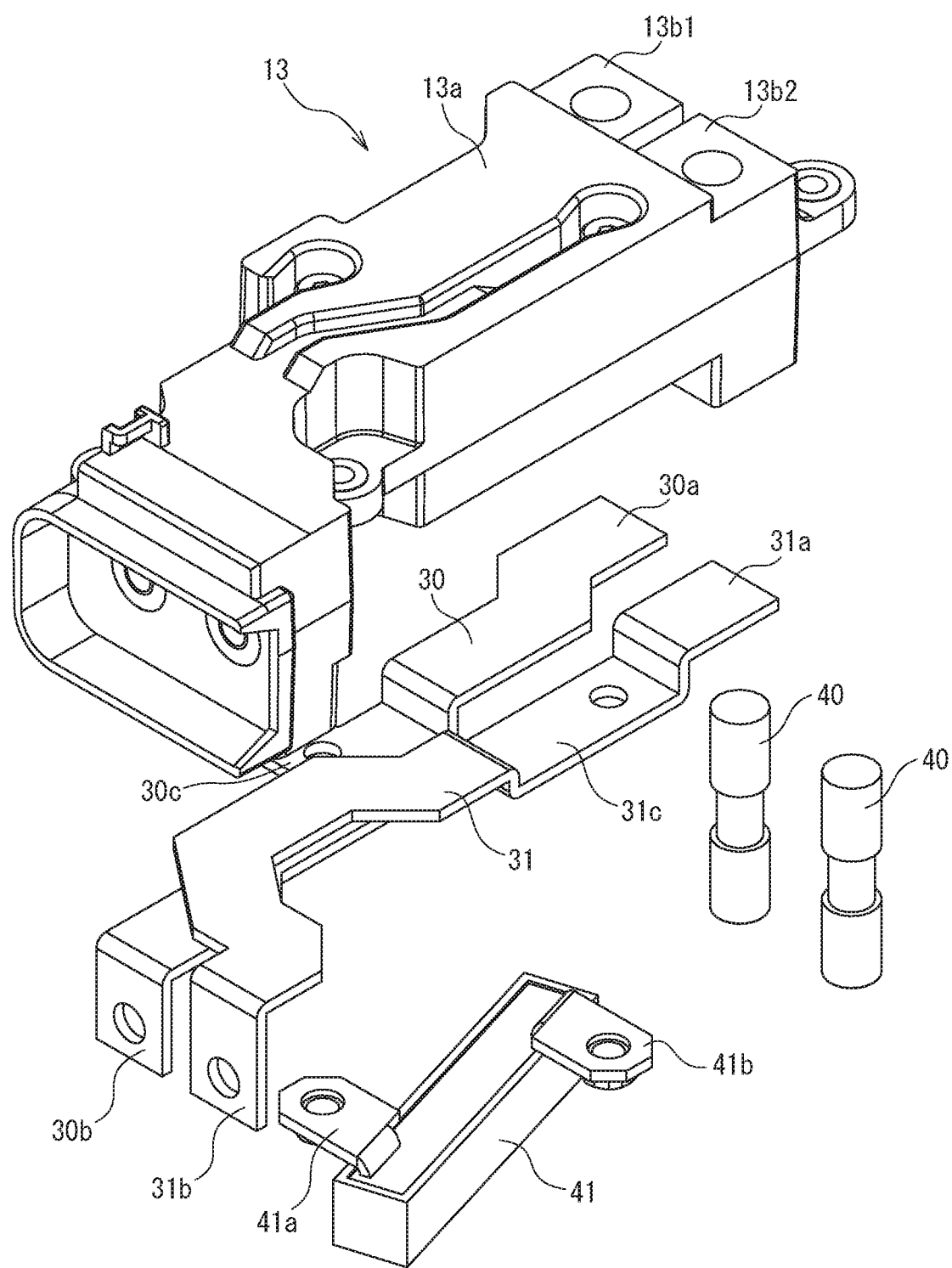
FIG. 8 is a perspective diagram illustrating a DC input connector that is the electronic component of the first embodiment.
Figure 9A:
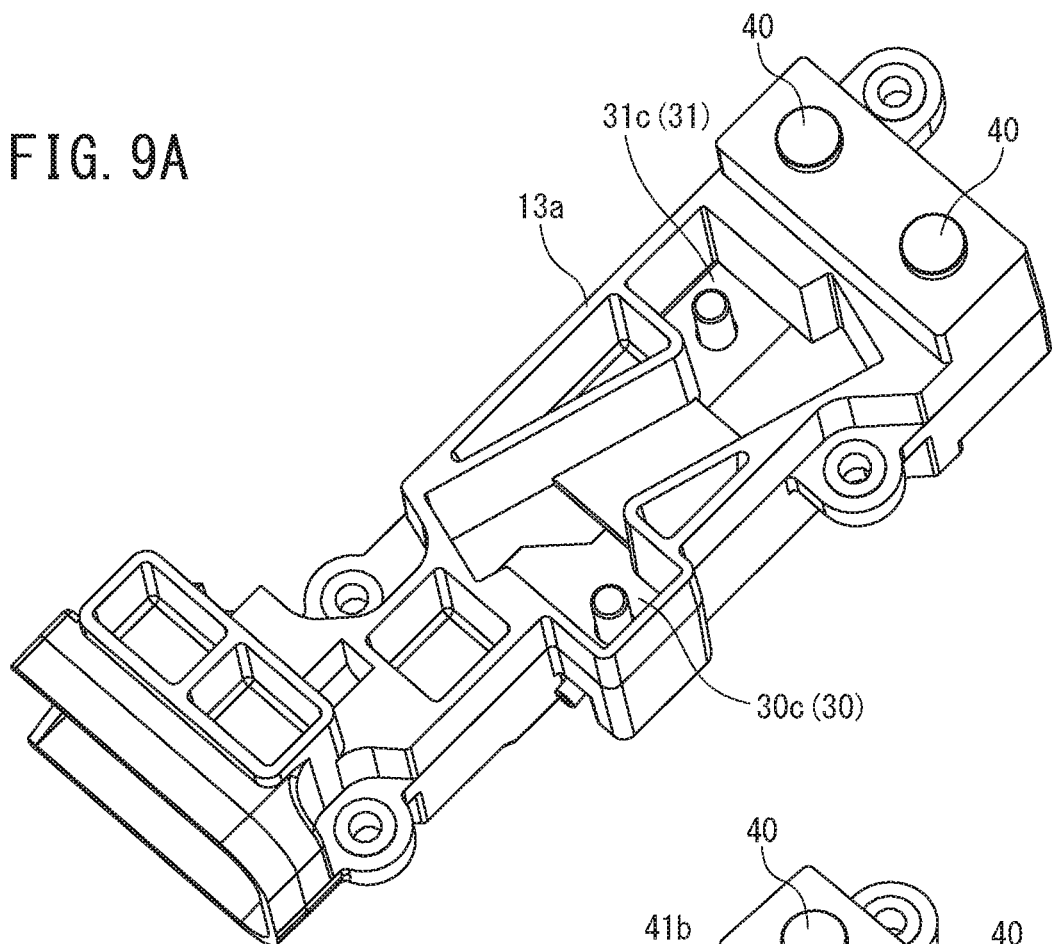
FIG. 9A is a diagram illustrating an input connector main body of a DC input unit.
Figure 9B:
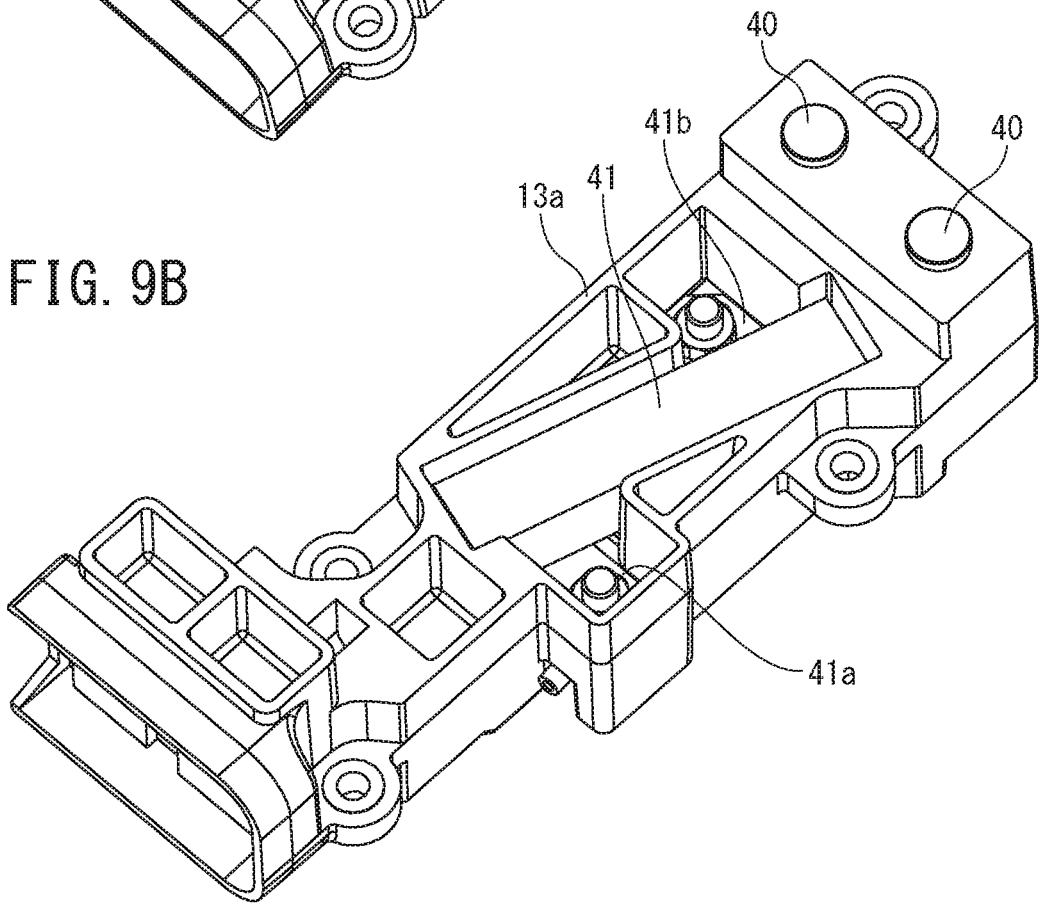
FIG. 9B is a diagram illustrating the input connector main body mounted with a discharge resistor.
Figure 10:
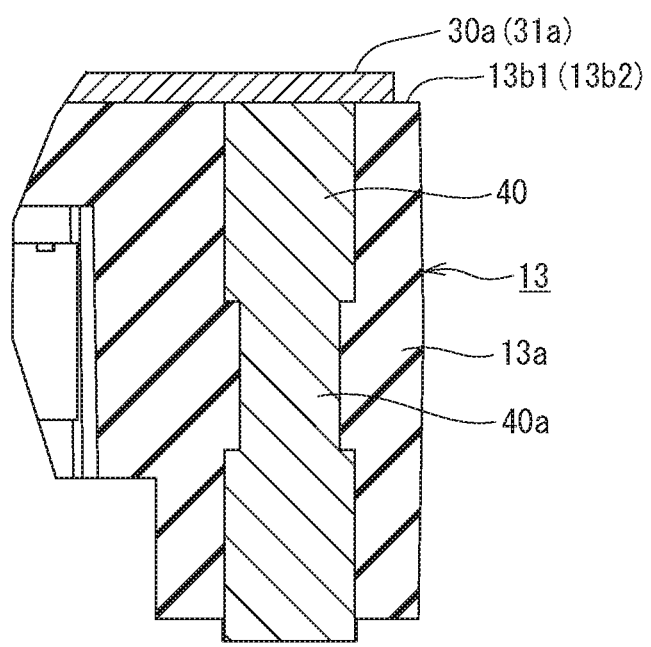
FIG. 10 is a diagram illustrating a heat dissipating member incorporated in a terminal block of the DC input unit of the first embodiment.

FIGS. 8 to 10 illustrate the DC input connector 13.

As illustrated in FIG. 8, the DC input connector 13 includes an input connector main body 13a made of a resin mold, a positive electrode-side bus bar 30 and a negative electrode-side bus bar 31 that are two plate-shaped bus bars arranged inside the input connector main body 13a and extending in the longitudinal direction, two cooling terminals 40 and 40 arranged inside the input connector main body 13a in such a manner as to contact with respective one ends 30a and 31a of the positive electrode-side bus bar 30 and the negative electrode-side bus bar 31, and a discharge resistor 41 electrically connected to longitudinal intermediate portions 30c and 31c of the positive electrode-side bus bar 30 and the negative electrode-side bus bar 31.

At a longitudinal one end of the input connector main body 13a are formed terminal blocks 13b1 and 13b2.

The cooling terminals 40 are round bar-shaped members formed of brass or the like having favorable thermal conductivity, and are insert-molded in the terminal blocks 13b1 and 13b2 in such a manner that upper and lower end faces thereof are exposed to outsides of the terminal blocks 13b1 and 13b2. At an axial center portion of each cooling terminal 40 is formed a reduced diameter portion 40a. The reduced diameter portion 40a serves to prevent the cooling terminal 40 from coming off when insert-molded in the input connector main body 13a.

The one end 30a of the positive electrode-side bus bar 30 is a capacitor-side terminal (hereinafter referred to as capacitor-side terminal 30a) connected to the positive electrode-side input terminal 28 of the smoothing capacitor 12, and the other end thereof is an external input-side terminal 30b connected to a positive electrode-side terminal of an external input converter (unillustrated), in which the capacitor-side terminal 30a is mounted on the terminal block 13b1.

In addition, the one end 31a of the negative electrode-side bus bar 31 is a capacitor-side terminal (hereinafter referred to as capacitor-side terminal 31a) connected to the negative electrode-side input terminal 29 of the smoothing capacitor 12, and the other end thereof is an external input-side terminal 31b connected to a negative electrode-side terminal of the external input converter, in which the capacitor-side terminal 31a is mounted on the terminal block 13b2.

The discharge resistor 41 is a device configured to control to discharge electric charge accumulated in the smoothing capacitor 12, and includes a connection terminal 41a connected to the longitudinal intermediate portion 30c of the positive electrode-side bus bar 30 and a connection terminal 41b connected to the longitudinal intermediate portion 31c of the negative electrode-side bus bar 31.

[Current Detector and AC Output Connector]

Figure 12:
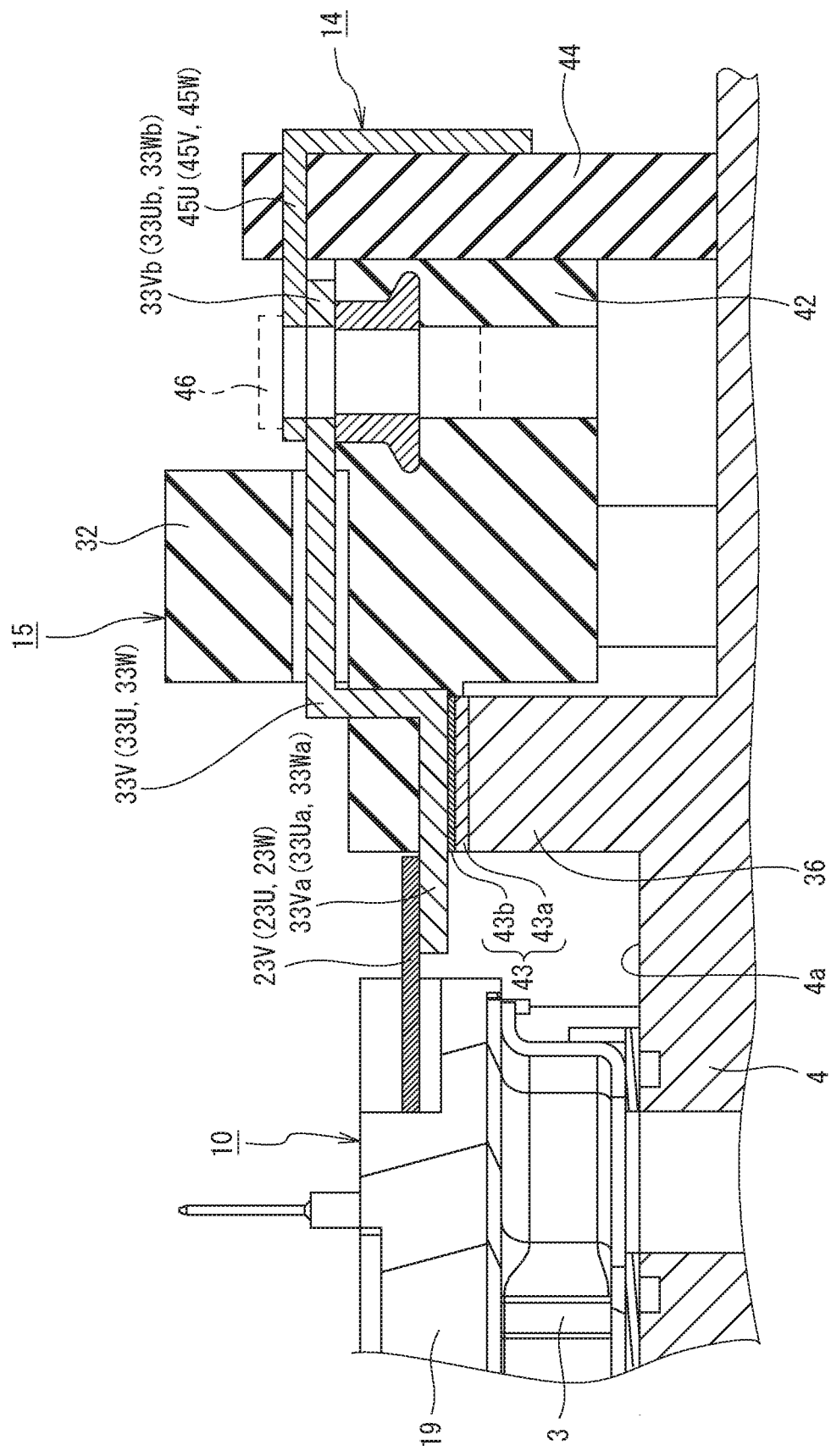
FIG. 12 is a diagram taken along arrow line B-B of FIG. 4.

The current detector 15 is a device configured to detect AC output current of the IGBT module 10, and, as illustrated in FIG. 12, includes a rectangular parallelepiped-shaped detector main body 32 and three plate-shaped detector bus bars 33U, 33V, and 33W spaced apart in a longitudinal direction of the detector main body 32. A terminal block 42 mounted with output terminals 33Ub, 33Vb, and 33Wb of the detector bus bars 33U, 33V, and 33W is integrally formed on the detector main body 32.

As illustrated in FIG. 12, one end of the detector bus bar 33V is an IGBT-side terminal 33Va connected to the output terminal 23V of the IGBT module 10, and the other end of the detector bus bar 33V is the output terminal 33Vb of the AC output connector 14.

Additionally, although unillustrated, at one ends of the other two detector bus bars 33U and 33W are formed IGBT-side terminals 33Ua and 33Wa, and at other ends thereof are formed the output terminals 33Ub and 33Wb.

Herein, a direct-bonded-copper (DBC) substrate 43 is integrally provided on lower surfaces of the IGBT-side terminals 33Ua, 33Va, and 33Wa of the three detector bus bars 33U, 33V, and 33W.

The DBC substrate 43 is a member formed by stacking together a ceramic layer 43a made of aluminum oxide or aluminum nitride and a copper layer 43b made of oxygen-free copper or tough-pitch copper, in which the copper layer 43b is bonded to the lower surfaces of the IGBT-side terminals 33Ua, 33Va, and 33Wa.

Then, when the current detector 15 is arranged in the third storage space S3, the IGBT-side terminals 33Ua, 33Va, and 33Wa of the three detector bus bars 33U, 33V, and 33W contact with the rising portion 36 protruding from the partial part of the bottom wall 4a via the DBC substrate 43 fixed to the lower surfaces thereof.

Furthermore, as illustrated in FIG. 12, the AD output connector 14 includes a rectangular parallelepiped-shape output connector main body 44 and three AC output bars 45U, 45V, and 45W spaced in a longitudinal direction of the output connector main body 44. The AD output bars 45U, 45V, and 45W are connected to the output terminals 33Ub, 33Vb, and 33Wb of the detector bus bars 33U, 33V, and 33W by a connection screw 46.

[Assembly of Power Conversion Device]

Next, a description will be given of assembly of the power conversion device 1.

Figure 11:
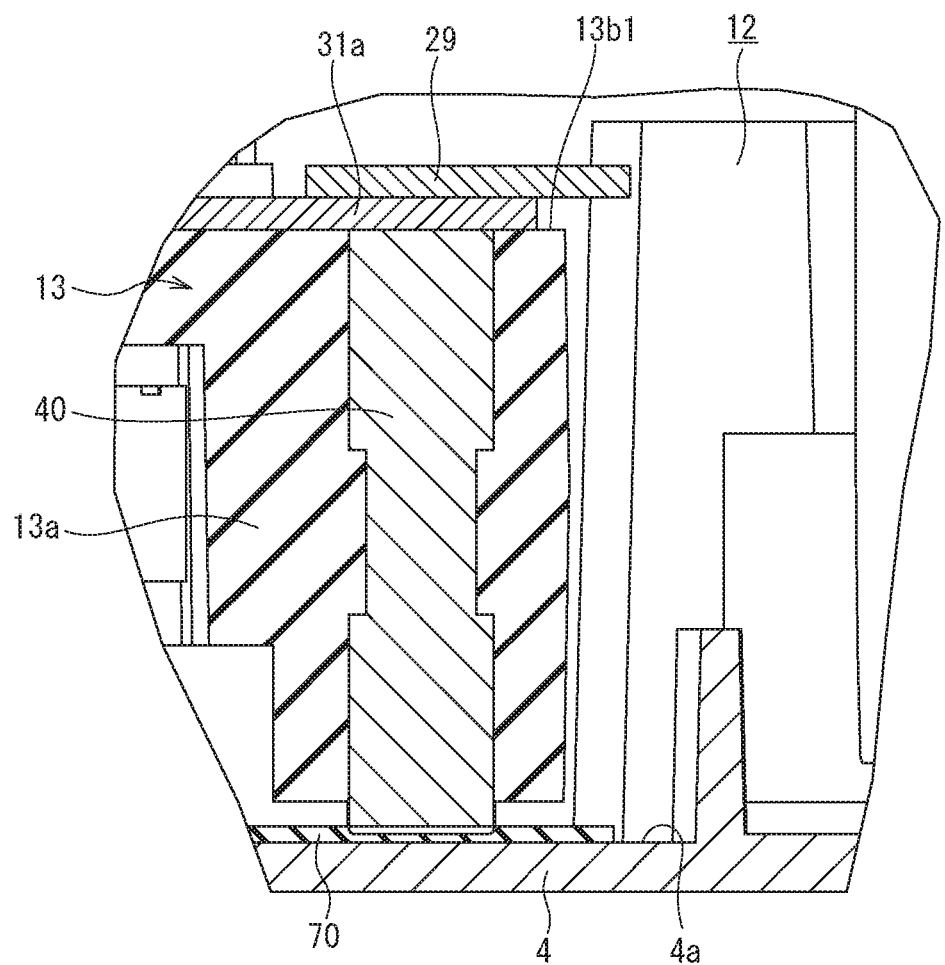
FIG. 11 is a diagram taken along arrow line A-A of FIG. 4.

First, an electrically insulating heat conducting sheet 70 is mounted on the bottom wall 4a of the second storage space S2 storing the DC input connector 13 in the case 4 illustrated in FIG. 2 (See FIG. 11).

Then, the DC input connector 13 is stored in the second storage space S2, and the AC output connector 14 and the current detector 15 are stored in the third storage space S3. The IGBT module 10 is stored in the fourth storage space S4, and the smoothing capacitor 12 are stored in the first storage space S1, followed by fixing these components to the bottom wall 4a.

By storing and fixing the IGBT module 10 in the fourth storage space S4, the inlet-side opening portion 3e of the cooler 3 integrated with the IGBT module 10 faces the inlet-side opening portion 9a formed on the bottom wall 4a of the fourth storage space S4, and then the O ring 16 mounted in a circumferential groove 9a1 outside the inlet-side opening portion 9a is crushed by a peripheral wall of the inlet-side opening portion 3e of the cooler 3, whereby the inlet-side opening portions 3e and 9a are connected while maintaining liquid tightness. In addition, similarly, in the outlet-side opening portion 3f of the cooler 3 and the outlet-side opening portion 9b of the fourth storage space S4 facing each other, the O ring 16 mounted in the circumferential groove 9a1 outside the outlet-side opening portion 9b is crushed by a peripheral wall of the outlet-side opening portion 3f of the cooler 3, whereby the outlet-side opening portions 3f and 9b are connected while maintaining liquid tightness, although unillustrated.

This enables cooling water supplied from the cooling water supply pipe 6a of the above-mentioned cooling water circulation portion CL to be supplied to an inside of the cooler 3 of the IGBT module 10 through the inlet-side opening portions 3e and 9a, and then enables water discharged from the cooler 3 to be discharged outside from the cooling water discharge pipe 6b through the outlet-side opening portions 3f and 9b.

Next, the capacitor-side terminal 30a protruding on the smoothing capacitor 12 side of the DC input connector 13 overlaps with the connection portion 28b of the positive electrode-side input terminal 28 of the smoothing capacitor 12, and the capacitor-side terminal 31b of the DC input connector 13 also overlaps with the negative electrode-side input terminal 29 of the smoothing capacitor 12. Thus, these overlapping portions are welded to be electrically connected.

As a result, as illustrated in FIG. 11, each cooling terminal 40 thermally contacts with lower surfaces of the electrically connected portions of the DC input connector 13 and the smoothing capacitor 12.

Furthermore, as illustrated in FIG. 12, a portion where the IGBT-side terminals 33Ua, 33Va, and 33Wa protruding on the IGBT module 10 side of the current detector 15 overlap with the output terminals 23U, 23V, and 23W of the IGBT module 10 is welded to be electrically connected.

As a result, a lower surface of the electrically connected portion of the current detector 15 and the IGBT module 10 thermally contacts with the rising portion 36 protruding from the partial part of the bottom wall 4a via the DBC substrate 43 fixed to the lower surfaces of the IGBT-side terminals 33Ua, 33Va, and 33Wa.

Figure 13:
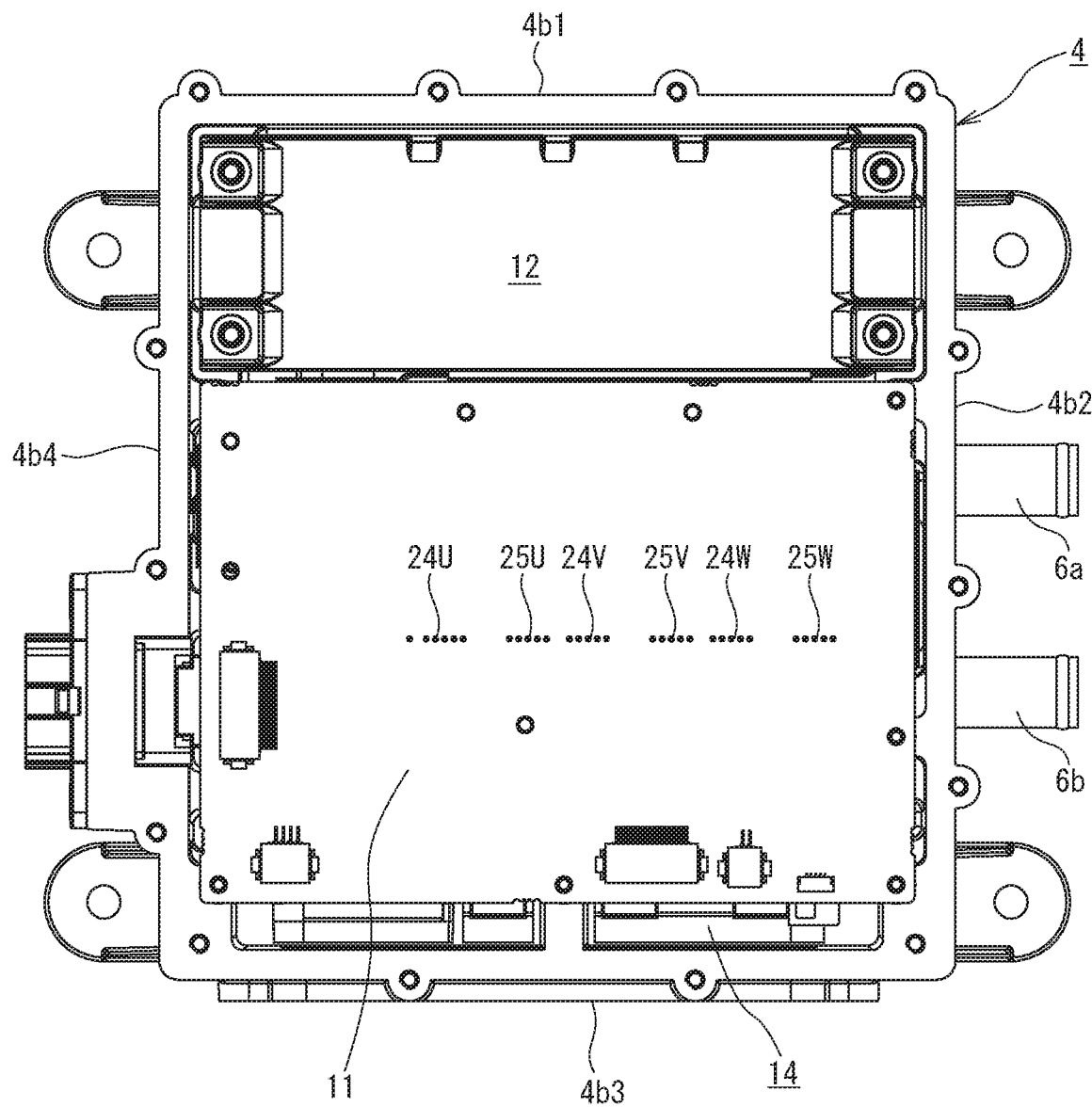
FIG. 13 is a diagram illustrating a state where a control circuit substrate is arranged inside the housing of the power conversion device illustrated in FIG. 1 such that the main components are covered.

Next, as illustrated in FIG. 13, a control circuit substrate 11 is arranged. In this case, the upper arm lead frames 24U, 24V, and 24W and the lower arm lead frames 25U, 25V, and 25W protruding from the upper surface of the IGBT module 10 are inserted through through holes with lands (unillustrated) in the control circuit substrate 11 to solder the respective lead frames and the through holes.

Then, the cover 5 is fixed to a peripheral edge of the opening portion 4c of the case 4. As a result, the IGBT module 10, the control circuit substrate 11, the smoothing capacitor 12, the DC input connector 13, the AC output connector 14, and the current detector 15 stored in the housing 2 are sealed with liquid tightness against outside air.

[Operation of Power Conversion Device]

In this state, DC power is supplied to the smoothing capacitor 12 from an external input converter (unillustrated) via the DC input connector 13, and the smoothing capacitor 12 smoothes the input DC voltage, and outputs to the IGBT module 10. Then, when a gate signal composed of, for example, a pulse width modulation signal is supplied to the IGBT module 10 from the control circuit substrate 11 to perform on/off control of the three IGBTs by the gate signal shifted by 120 degrees, three-phase AC consisting of phases U, V, and W is output from the IGBT module 10 to a load via the current detector 15 and the AC output connector 14.

When the three IGBTs of the IGBT module 10 are operated, the upper and lower arm semiconductor chips of the three IGBTs embedded in the resin package 19a generate heat.

In addition, the connection terminals of the DC input connector 13 and the smoothing capacitor 12 also have large heat loss and generate heat. Moreover, the current detector 15 detecting the three-phase AC output of the IGBT module 10 also generates heat.

Heat generated at the upper and lower arm semiconductor chips of the IGBT module 10 is conducted to the cooler 3 integrally provided on the module main body 19 of the IGBT module 10.

The heat conducted to the cooler 3 of the IGBT module 10 is moved by the cooling water circulating through the cooler 3, so that the upper and lower arm semiconductor chips of the IGBT module 10 are efficiently cooled.

In addition, under the connection terminals of the DC input connector 13 and the smoothing capacitor 12 (the capacitor-side terminals 30*a* and 31*a* of the DC input connector 13 and the positive electrode-side input terminal 28 and the negative electrode-side input terminal 29 of the smoothing capacitor 12), the cooling terminals 40 are embedded inside the terminal blocks 13*b*1 and 13*b*2 integrated with the DC input connector 13. Thus, heat generated at the positive electrode-side bus bar 30 and the negative electrode-side bus bar 31 is conducted to the bottom wall 4*a* of the case 4 via the cooling terminals 40 and the heat conducting sheet 70 made of resin arranged under the cooling terminals 40 (see FIG. 11).

Additionally, under the connection terminals of the IGBT module 10 and the current detector 15 (the output terminals 23U, 23V, and 23W of the IGBT module 10 and the IGBT-side terminals 33Ua, 33Va, and 33Wa of the current detector 15), the DBC substrate 43 including the ceramic layer 43*a* and the copper layer 43*b* is integrally provided and is in contact with the rising portion 36 protruding from the bottom wall 4*a*. Thus, heat generated at the connection terminals of the IGBT module 10 and the current detector 15 is conducted to the bottom wall 4*a* via the DBC substrate 43 and the rising portion 36 (see FIG. 12).

Then, on the bottom wall 4*a* of the case 4 are provided the inlet-side flow path 18*a* and the outlet-side flow path 18*b* of the cooling water circulation portion CL through which cooling water circulates, so that the bottom wall 4*a* has high heat dissipation capability. Accordingly, the heat conducted to the bottom wall 4*a* of the case 4 via the cooling terminals 40 and the heat conducting sheet 70 and the heat conducted to the bottom wall 4*a* via the DBC substrate 43 and the rising portion 36 move to the bottom wall 4*a* having the high heat dissipation capability, so that the IGBT module 10, the connection terminals of the DC input connector 13 and the smoothing capacitor 12, and the connection terminals of the IGBT module 10 and the current detector 15 are efficiently cooled.

Herein, the electronic component according to the present invention corresponds to the DC input connector 13; the electronic component main body according to the present invention corresponds to the input connector main body 13*a*; the terminal block according to the present invention corresponds to the terminal blocks 13*b*1 and/or 13*b*2; the connection terminal portion of the bus bar according to the present invention corresponds to the capacitor-side terminals 30*a* and/or 30*b*; the heat dissipating member according to the present invention corresponds to at least one of the cooling terminals 40; and the heat sink portion according to the present invention corresponds to the cooling water circulation portion provided on the case 4.

Advantageous Effects of Power Conversion Device Including Electronic Component of First Embodiment Next, a description will be given of advantageous effects of the power conversion device 1 including the DC input connector 13 that is the electronic component of the first embodiment.

Even when the upper and lower semiconductor chips of the three IGBTs embedded in the resin package 19*a* generate heat due to operation of the three IGBTs of the IGBT module 10, cooling water is allowed to circulate to the cooler 3 of the IGBT module 10 from the cooling water circulation portion CL, thereby enabling the upper and lower arm semiconductor chips of the IGBT module 10 to be efficiently cooled.

Additionally, when heat is generated in the connection terminals of the DC input connector 13 and the smoothing capacitor 12 (the capacitor-side terminals 30*a* and 31*a* of the DC input connector 13 and the positive electrode-side input terminal 28 and the negative electrode-side input terminal 29 of the smoothing capacitor 12), the cooling terminals 40 embedded inside the terminal blocks 13*b*1 and 13*b*2 integrated with the DC input connector 13 conduct heat to the bottom wall 4*a* of the case 4 via the heat conducting sheet 70. However, the bottom wall 4*a* is provided with the inlet-side flow path 18*a* and the outlet-side flow path 18*b* of the cooling water circulation portion CL through which cooling water circulates, thus enabling efficient cooling of the connection portions.

Furthermore, when heat is generated in the connection terminals of the IGBT module 10 and the current detector 15 (the output terminals 23U, 23V, and 23W of the IGBT module 10 and the IGBT-side terminals 33Ua, 33Va, and 33Wa of the current detector 15), the DBC substrate 43 integrally provided on the lower portions of the IGBT-side terminals 33Ua, 33Va, and 33Wa conducts the heat to the bottom wall 4*a* of case 4 having the high heat dissipation capability via the rising portion 36, thus enabling efficient cooling of the connection portions.

In addition, since the cooling terminals 40 of the DC input connector 13 are embedded in the terminal blocks 13*b*1 and 13*b*2, it is unnecessary to provide a space for cooling function (the cooling terminals 40) in the second storage space S2 for storing the DC input connector 13.

Additionally, since the DBC substrate 43 of the current detector 15 is integrally provided on the lower surfaces of the IGBT-side terminals 33Ua, 33Va, and 33Wa, it is unnecessary to provide a space for cooling function in the current detector 15.

Thus, the DC input connector 13 and the current detector 15 do not need a space for cooling function and are compact in structure, thus enabling miniaturization of the power conversion device 1.

Note that while the cooling terminals 40 of the DC input connector 13 are linearly extending members and are embedded inside the terminal blocks 13*b*1 and 13*b*2, they may be formed into a shape bent in an L shape and arranged such that one ends thereof thermally contact with the capacitor-side terminals 30*a* and 31*a*, and other ends thereof thermally contact with, for example, a side face denoted by reference sign 72 inside the case 4 in FIG. 2. This allows contact at a position near the cooling water circulation portion CL through which cooling water circulates, thus improving cooling efficiency.

Furthermore, the DBC substrate 43 integrally provided on the lower surfaces of the IGBT-side terminals 33Ua, 33Va, and 33Wa of the detector bus bars 33U, 33V, and 33W is formed by the two layers including the copper layer 43*b* bonded to the lower surfaces of the IGBT-side terminals 33Ua, 33Va, and 33Wa and the ceramic layer 43*a* bonded to the copper layer 43*b*. However, when the DBC substrate is formed by bonding a copper layer to an outside of the ceramic layer 43*a*, durability of the ceramic layer 43*a* against impact can be improved.

INDUSTRIAL APPLICABILITY

As described hereinabove, the electronic component and the power conversion device according to the present invention are useful to enable miniaturization to be achieved while including the cooling structure.

REFERENCE SIGNS LIST

1: Power conversion device
2: Housing
3: Cooler
3a: Bottom wall
3e: Inlet-side opening portion
3f: Outlet-side opening portion
4: Case
4a: Bottom wall
4b1 to 4b4: First sidewall to Fourth sidewall
4c: Opening portion
4e: External input connection port
4f: External output connection port
5: Cover
6a: Cooling water supply pipe
6b: Cooling water discharge pipe
9a: Inlet-side opening portion
9b: Outlet-side opening portion
10: IGBT module
11: Control circuit substrate
12: Smoothing capacitor
12a: Capacitor main body
12b: Side face
13: DC input connector
13a: Input connector main body
13b1, 13b2: Terminal block
14: AC output connector
15: Current detector
16: O ring
18a: Inlet-side flow path
18b: Outlet-side flow path
19: Module main body
19a: Resin package
20a, 20b: Side face
21U, 21V, 21W: Positive electrode-side terminal
22U, 22V, 22W: Negative electrode-side terminal
23U, 23V, 23W: Output terminal
25U, 25V, 25W: Lower arm lead frame
26U, 26V, 26W: Positive electrode-side output terminal
27U, 27V, 27W: Negative electrode-side output terminal
28: Positive electrode-side input terminal
28a: Base portion
28b: Connection portion
29: Negative electrode-side input terminal
30: Positive electrode-side bus bar
30a: Capacitor-side terminal
30b: External input-side terminal
30c, 31c: Longitudinal intermediate portion
31: Negative electrode-side bus bar
31a: Capacitor-side terminal
31b: External input-side terminal
32: Detector main body
33U, 33V, 33W: Detector bus bar
33Ua, 33Va, 33Wa: IGBT-side terminal
33Ub, 33Vb, 33Wb: Output terminal
36: Rising portion
40: Cooling terminal
41: Discharge resistor
41a, 41b: Connection terminal
42: Terminal block
43: DBC substrate
43a: Ceramic layer
43b: Copper layer
44: Output connector main body
45U, 45V, 45W: AC output bar
46: Connection screw
70: Heat conducting sheet
CL: Cooling water circulation portion
S1 to S4: First to fourth storage space

The invention claimed is:

1. An electronic component, comprising:
an electronic component main body;
a bus bar arranged in an inside of the electronic component main body;
a heat dissipating member embedded in the electronic component main body, having one end face in direct contact with the bus bar, an other end face exposed to an outside of the electronic component main body, the one end face of the heat dissipating member facing in a first direction toward the bus bar and away from an upper surface of the electronic component main body, and the other end face of the heat dissipating member facing in a second direction opposite of the first direction away from a lower surface of the electronic component main body.

2. The electronic component according to claim 1, further comprising:
a terminal block integrally formed on the electronic component main body,
wherein
one end of the bus bar is mounted on the terminal block, and
the one end face of the heat dissipating member is exposed to an outside of the terminal block and is in direct contact with the one end of the bus bar.

3. The electronic component according to claim 2, wherein the heat dissipating member has a linear shape, and the other end face of the heat dissipating member is exposed to the outside of the terminal block at a surface opposite to a surface where the one end face is exposed to the outside of the terminal block.

4. The electronic component according to claim 3, further comprising an electronic element arranged in the inside of the electronic component main body and electrically connected to the bus bar.

5. The electronic component according to claim 3, further comprising an external connection portion integrally formed on the electronic component main body, wherein the other end of the bus bar is exposed to the external connection portion.

6. The electronic component according to claim 1, comprising an electronic element arranged in the inside of the electronic component main body and electrically connected to the bus bar.

7. The electronic component according to claim 6, wherein the electronic component main body includes an open face, and the electronic element is attachable and detachable via the open face.

8. The electronic component according to claim 1, including an external connection portion integrally formed on the electronic component main body, wherein an end of the bus bar is exposed to the external connection portion.

9. The electronic component according to claim 8, further comprising an electronic element arranged in the inside of the electronic component main body and electrically connected to the bus bar.

10. The electronic component according to claim 2, wherein the one end of the bus bar is in contact with a heating element, and the one end face of the heat dissipating member is in direct contact with the one end of the bus bar.

11. The electronic component according to claim 2, further comprising an electronic element arranged in the inside of the electronic component main body and electrically connected to the bus bar.

12. The electronic component according to claim 2, further comprising an external connection portion integrally formed on the electronic component main body, wherein the other end of the bus bar is exposed to the external connection portion.

13. The electronic component according to claim 1, wherein the heat dissipating member includes:
   a cylinder-shaped upper portion including the one end face,
   a cylinder-shaped lower portion including the other end face, and
   a cylinder-shaped middle portion which connects the upper portion and lower portion, and having a diameter which is less than a diameter of each of the upper and lower portions of the heat dissipating member.

14. A power conversion device, comprising:
   a housing including a heat sink portion; and
   an electronic component stored in the housing, the electronic component including:
      an electronic component main body,
      a terminal block, configured to support a connection terminal portion of a bus bar extending from the electronic component main body, integrally formed on the electronic component main body, and
      a heat dissipating member, configured to thermally connect the connection terminal portion and the heat sink portion, the heat dissipating member being provided in an inside of the terminal block, thermally connected to the heat sink portion, and having one end face which faces in a first direction toward the bus bar and the other end face which faces in a second direction opposite of the first direction toward a bottom wall of the housing.

15. The power conversion device according to claim 14, wherein the heat dissipating member is a metal member embedded in the terminal block made of resin, the heat dissipating member having the one end face thermally in contact with the connection end portion and the other end face thermally in contact with the heat sink portion via an insulation sheet.

16. The power conversion device according to claim 14, wherein the heat sink portion is an inner wall of the housing including a cooling medium flow path in which a cooling medium flows.

17. The power conversion device according to claim 14, wherein the heat sink portion is a cooling member for a power semiconductor module stored in the housing.

18. The power conversion device according to claim 14, wherein
   the one end face of the heat dissipating member is exposed to an outside of the terminal block and is in physical contact with one end of the bus bar, and
   and the other end face of the heat dissipating member is exposed to an outside of the electronic component main body and faces the bottom wall of the housing.

19. The power conversion device according to claim 14, wherein the heat dissipating member includes:
   a cylinder-shaped upper portion including the one end face,
   a cylinder-shaped lower portion including the other end face, and
   a cylinder-shaped middle portion which connects the upper portion and lower portion, and having a diameter which is less than a diameter of each of the upper and lower portions of the heat dissipating member.

20. The power conversion device according to claim 14, wherein
   the electronic component is a DC input connector, and
   the power conversion device further comprises:
   a smoothing capacitor provided adjacent to one side of the DC input connector, adjacent to the terminal block and one end of the bus bar having the connection terminal portion, and
   a current detector provided adjacent to another side of the DC input connector.

* * * * *

UNITED STATES PATENT AND TRADEMARK OFFICE
CERTIFICATE OF CORRECTION

| | |
|---|---|
| PATENT NO. | : 10,881,023 B2 |
| APPLICATION NO. | : 16/370375 |
| DATED | : December 29, 2020 |
| INVENTOR(S) | : Takanori Shintani et al. |

Page 1 of 1

It is certified that error appears in the above-identified patent and that said Letters Patent is hereby corrected as shown below:

In the Claims

Column 14, Line 17:
In Claim 18, before "the other" delete "and".

Signed and Sealed this
Sixth Day of April, 2021

Drew Hirshfeld
*Performing the Functions and Duties of the*
*Under Secretary of Commerce for Intellectual Property and*
*Director of the United States Patent and Trademark Office*